US012742831B2

(12) United States Patent
Suzuki et al.

(10) Patent No.: US 12,742,831 B2
(45) Date of Patent: Sep. 22, 2026

(54) ELECTRICALLY POWERED VEHICLE AND METHOD OF DIAGNOSING DETERIORATION OF VEHICLE BATTERY

(71) Applicant: TOYOTA JIDOSHA KABUSHIKI KAISHA, Toyota Aichi-ken (JP)

(72) Inventors: Kentaro Suzuki, Kariya Aichi-ken (JP); Yuta Sugiyama, Toyota Aichi-ken (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 410 days.

(21) Appl. No.: 18/369,876

(22) Filed: Sep. 19, 2023

(65) Prior Publication Data

US 2024/0103091 A1 Mar. 28, 2024

(30) Foreign Application Priority Data

Sep. 26, 2022 (JP) ................................ 2022-152512

(51) Int. Cl.
*G01R 31/392* (2019.01)
*B60L 58/16* (2019.01)
*G01R 31/367* (2019.01)
*G01R 31/396* (2019.01)

(52) U.S. Cl.
CPC ............ *G01R 31/392* (2019.01); *B60L 58/16* (2019.02); *G01R 31/367* (2019.01); *G01R 31/396* (2019.01)

(58) Field of Classification Search
CPC ..... B60L 58/16; G01R 31/367; G01R 31/374; G01R 31/382; G01R 31/392; G01R 31/396
See application file for complete search history.

(56) References Cited

U.S. PATENT DOCUMENTS 10,451,684 B2 * 10/2019 Murase .............. H01M 50/204
2013/0076313 A1 * 3/2013 Kim ........................ B60L 53/11 320/150
2013/0338867 A1 * 12/2013 Sato ...................... B60W 20/13 903/903
2017/0096135 A1 4/2017 Kishimoto et al.
2022/0371472 A1 11/2022 Okubo et al.

FOREIGN PATENT DOCUMENTS

JP 2013-044598 A 3/2013
JP 2017-065607 A 4/2017
JP 2021-083188 A 5/2021
JP 2022-179931 A 12/2022

* cited by examiner

*Primary Examiner* — Yoshihisa Ishizuka
(74) *Attorney, Agent, or Firm* — Dinsmore & Shohl LLP

(57) ABSTRACT

When a PCU (inverter) of an electrically powered vehicle fails, a first map where a temperature and a current of a battery are defined as parameters or a second map where a temperature and a rate of change in voltage of the battery are defined as parameters is used to determine whether or not rapid deterioration of the battery has occurred. When it is determined that the rapid deterioration of the battery has occurred, a battery replacement indicator is turned on.

7 Claims, 6 Drawing Sheets

FIG.3

FIRST MAP

| | | CURRENT IB (A) | | | | | | | | | | | |
|---|---|---|---|---|---|---|---|---|---|---|---|---|---|
| | | 0 → | | | | | | | | | | | |
| TEMPERATURE TB | + | ○ | ○ | ○ | ○ | ○ | ○ | ○ | ○ | ○ | ○ | ○ | ○ |
| | ↑ | ○ | ○ | ○ | ○ | ○ | ○ | ○ | ○ | ○ | ○ | ○ | ○ |
| | | ○ | ○ | ○ | ○ | ○ | ○ | ○ | ○ | ○ | ○ | ○ | ○ |
| | | ○ | ○ | ○ | ○ | ○ | ○ | ○ | ○ | ○ | × | × | × |
| | | ○ | ○ | ○ | ○ | ○ | ○ | × | × | × | × | × | × |
| | | ○ | ○ | ○ | ○ | ○ | ○ | × | × | × | × | × | × |
| | | ○ | ○ | ○ | ○ | ○ | × | × | × | × | × | × | × |
| | 0 | ○ | ○ | ○ | ○ | × | × | × | × | × | × | × | × |
| | | ○ | ○ | ○ | × | × | × | × | × | × | × | × | × |
| | | ○ | ○ | ○ | × | × | × | × | × | × | × | × | × |
| | ↓ | ○ | ○ | × | × | × | × | × | × | × | × | × | × |
| (°C) | − | ○ | × | × | × | × | × | × | × | × | × | × | × |

FIG.4

SECOND MAP

| TEMPERATURE TB (°C) | RATE OF CHANGE IN VB ΔVB (V/sec) 0 → | | | | | | | | | | | |
|---|---|---|---|---|---|---|---|---|---|---|---|---|
| + | ○ | × | × | × | × | × | × | × | × | × | × | × |
| ↑ | ○ | × | × | × | × | × | × | × | × | × | × | × |
| | ○ | × | × | × | × | × | × | × | × | × | × | × |
| | ○ | ○ | × | × | × | × | × | × | × | × | × | × |
| | ○ | ○ | × | × | × | × | × | × | × | × | × | × |
| | ○ | ○ | × | × | × | × | × | × | × | × | × | × |
| | ○ | ○ | × | × | × | × | × | × | × | × | × | × |
| 0 | ○ | ○ | ○ | × | × | × | × | × | × | × | × | × |
| | ○ | ○ | ○ | ○ | ○ | × | × | × | × | × | × | × |
| | ○ | ○ | ○ | ○ | ○ | ○ | ○ | ○ | ○ | × | × | × |
| ↓ | ○ | ○ | ○ | ○ | ○ | ○ | ○ | ○ | ○ | ○ | × | × |
| − | ○ | ○ | ○ | ○ | ○ | ○ | ○ | ○ | ○ | ○ | × | × |

ELECTRICALLY POWERED VEHICLE AND METHOD OF DIAGNOSING DETERIORATION OF VEHICLE BATTERY

CROSS REFERENCE TO RELATED APPLICATIONS

This nonprovisional application is based on Japanese Patent Application No. 2022-152512 filed with the Japan Patent Office on Sep. 26, 2022, the entire contents of which are hereby incorporated by reference.

BACKGROUND

Field

The present disclosure relates to an electrically powered vehicle and a method of diagnosing deterioration of a vehicle battery.

Description of the Background Art

A battery electric vehicle (BEV), a plug-in hybrid electric vehicle (PHEV), a hybrid electric vehicle (HEV), and the like have been known as electrically powered vehicles on which a battery as a motive power source is mounted. In the electrically powered vehicle, a power control unit (PCU) as a power conversion device is used to supply electric power stored in the battery to a motor generator (MG) that drives drive wheels, to thereby drive the drive wheels.

According to Japanese Patent Laying-Open No. 2021-83188, in an electrically powered vehicle including two MGs, when an abnormal condition of an inverter that drives one MG and a peripheral device of the inverter is detected, a gate command for the inverter is cut off and the other MG is driven for travel in a limp home mode, and when a counter electromotive voltage (counter electromotive force) resulting from regeneration by one MG becomes higher than a battery voltage, a main relay of the battery is opened to continue travel in the limp home mode of the electrically powered vehicle.

SUMMARY

The MG includes a winding (coil). When a device that controls the MG is in an abnormal condition or fails, a counter electromotive force may be generated by an inductive voltage produced by the coil simultaneously with occurrence of the abnormal condition or the failure, and may be applied to the battery. When this counter electromotive force is generated, a high current is instantaneously generated. Therefore, the high current may be applied to the battery before a protective function such as cut-off of the main relay is activated.

When a high current is applied to the battery, the battery is greatly damaged and may abruptly deteriorate. Abrupt deterioration of the battery is also referred to as "rapid deterioration" below. Japanese Patent Laying-Open No. 2021-83188 does not mention rapid deterioration of the battery by the counter electromotive force.

An object of the present disclosure is to diagnose whether or not a battery has rapidly deteriorated when a high current caused by a counter electromotive force is applied to the battery.

An electrically powered vehicle in the present disclosure is an electrically powered vehicle including a battery, a motor generator driven with electric power stored in the battery, and a diagnosis device that diagnoses deterioration of the battery. The diagnosis device is configured to determine whether or not rapid deterioration has occurred in the battery based on a temperature of the battery and a value of a current inputted to the battery or based on a temperature of the battery and a rate of change in voltage of the battery, when a counter electromotive force is applied to the battery.

When the counter electromotive force is applied to the battery and a high current is inputted thereto, for example, lithium is precipitated in a lithium ion battery. In particular, as a battery temperature is lower, precipitation of lithium is more likely. When the high current is inputted to the battery, a voltage of the battery abruptly increases and a rate of change in voltage (an amount of change in voltage per unit time) becomes higher. When the rate of change in voltage of the battery is high, an internal resistance abruptly deteriorates (increases). In particular, as the battery temperature is higher, the internal resistance increases.

According to this configuration, when the counter electromotive force is applied to the battery, the diagnosis device of the electrically powered vehicle determines whether or not rapid deterioration has occurred in the battery based on the temperature of the battery and the value of the current inputted to the battery. Alternatively, when the counter electromotive force is applied to the battery, the diagnosis device of the electrically powered vehicle determines whether or not rapid deterioration has occurred in the battery based on the temperature of the battery and the rate of change in voltage of the battery. Whether or not the battery has rapidly deteriorated can thus be diagnosed when the high current caused by the counter electromotive force is applied to the battery.

In some embodiments, the electrically powered vehicle further includes a power control unit that supplies electric power stored in the battery to the motor generator and controls the motor generator. When the power control unit fails, the diagnosis device determines that the counter electromotive force has been applied to the battery.

When the power control unit fails, simultaneously with the failure, the counter electromotive force may be generated by an inductive voltage produced by the coil (winding) of the motor generator. According to this configuration, when this counter electromotive force is generated and the high current is inputted to the battery, whether or not rapid deterioration has occurred in the battery can be determined.

In some embodiments, the diagnosis device may include a first map where the temperature of the battery and the value of the current inputted to the battery are defined as parameters and a second map where the temperature of the battery and the rate of change in voltage of the battery are defined as parameters, and may use the first map or the second map to determine whether or not the rapid deterioration of the battery has occurred. In this case, the first map may be set such that it is determined that the rapid deterioration of the battery has occurred in a region where the temperature of the battery is low and the value of the current inputted to the battery is large, and the second map may be set such that it is determined that the rapid deterioration of the battery has occurred in a region where the temperature of the battery is high and the rate of change in voltage of the battery is high.

According to this configuration, the first map or the second map can be used to search (check) the map to thereby detect (determine) rapid deterioration of the battery. The first map or the second map can be created (set) in advance, for example, depending on specifications (characteristics) or a type of the battery, and rapid deterioration can suitably be detected.

In some embodiments, the diagnosis device may make a diagnosis that replacement of the battery is required when the diagnosis device determines that the rapid deterioration has occurred in the battery based on the temperature of the battery and the value of the current inputted to the battery or when the diagnosis device determines that the rapid deterioration has occurred in the battery based on the temperature of the battery and the rate of change in voltage of the battery.

According to this configuration, when it is determined that rapid deterioration has occurred in the battery, diagnosis that replacement of the battery is required is made. Therefore, when the counter electromotive force is applied to the battery, determination as to requirement for replacement of the battery can suitably be made.

In some embodiments, the diagnosis device may make a diagnosis that replacement of the battery is required when the diagnosis device determines that the rapid deterioration has occurred in the battery based on the temperature of the battery and the value of the current inputted to the battery and when the diagnosis device determines that the rapid deterioration has occurred in the battery based on the temperature of the battery and the rate of change in voltage of the battery.

According to this configuration, since diagnosis that replacement of the battery is required is made when it is determined that rapid deterioration has occurred in the battery based on such parameters as the value of the current inputted to the battery and the rate of change in voltage of the battery, determination as to requirement for replacement of the battery can suitably be made at the time of application of the counter electromotive force to the battery.

A method of diagnosing deterioration of a battery for an electrically powered vehicle in the present disclosure is a method of diagnosing deterioration of a vehicle battery mounted as a motive power source on the electrically powered vehicle. The method of diagnosing a vehicle battery includes determining whether or not a counter electromotive force has been applied to the battery and determining whether or not rapid deterioration has occurred in the vehicle battery based on a temperature of the vehicle battery and a value of a current inputted to the vehicle battery when the counter electromotive force is applied to the vehicle battery.

According to this method, when it is determined that the counter electromotive force has been applied to the vehicle battery, whether or not rapid deterioration has occurred in the vehicle battery is determined based on the temperature of the vehicle battery and the value of the current inputted to the vehicle battery. Thus, when a high current caused by the counter electromotive force is applied to the vehicle battery, whether or not the vehicle battery has rapidly deteriorated can be diagnosed.

In some embodiments, the method of diagnosing deterioration of a vehicle battery may further include determining whether or not the rapid deterioration has occurred in the vehicle battery based on the temperature of the vehicle battery and a rate of change in voltage of the vehicle battery when the counter electromotive force is applied to the vehicle battery.

According to this method, when it is determined that the counter electromotive force has been applied to the vehicle battery, whether or not rapid deterioration has occurred in the vehicle battery is determined based on the temperature of the vehicle battery and the rate of change in voltage of the vehicle battery. Thus, when a high current caused by the counter electromotive force is applied to the vehicle battery, whether or not the vehicle battery has rapidly deteriorated can be diagnosed also based on the temperature of the vehicle battery and the rate of change in voltage of the vehicle battery.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 3 is a diagram showing an exemplary first map for determination as to rapid deterioration of a battery.

FIG. 4 is a diagram showing an exemplary second map for determination as to rapid deterioration of the battery.

DESCRIPTION OF THE EMBODIMENTS

Figure 1:
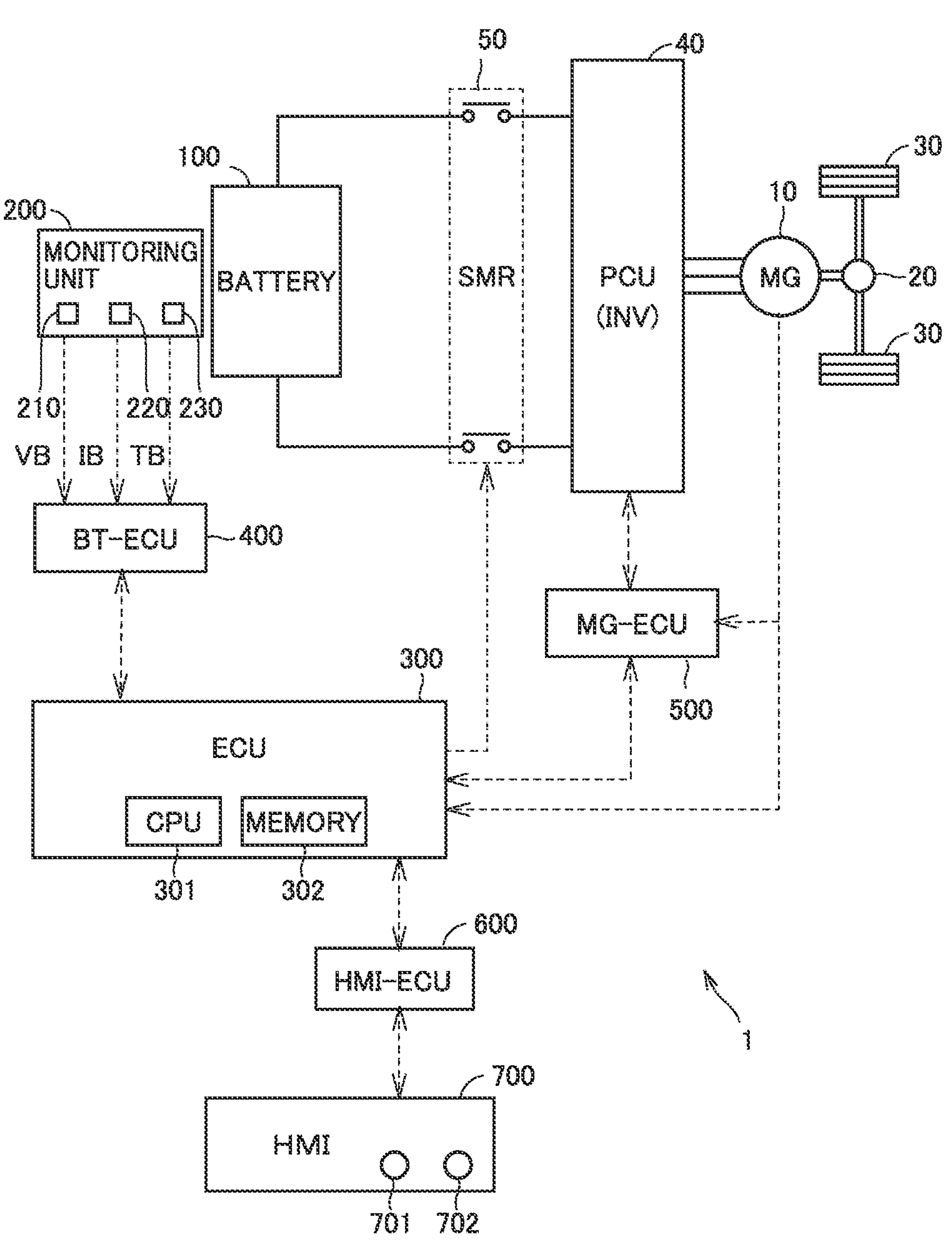
FIG. 1 is a diagram of an overall configuration of an electrically powered vehicle according to the present embodiment.

An embodiment of the present disclosure will be described in detail below with reference to the drawings. The same or corresponding elements in the drawings have the same reference characters allotted and description thereof will not be repeated.

FIG. 1 is a diagram of an overall configuration of an electrically powered vehicle according to the present embodiment. In the present embodiment, an electrically powered vehicle 1 is, for example, a battery electric vehicle. Electrically powered vehicle 1 includes a motor generator (MG) 10 which is a rotating electric machine, a motive power transmission gear 20, a drive wheel 30, a power control unit (PCU) 40, a system main relay (SMR) 50, a battery 100, a monitoring unit 200, and an electronic control unit (ECU) 300 that controls electrically powered vehicle 1.

MG 10 is, for example, an interior permanent magnet synchronous electric motor (IPM motor), and performs a function as an electric motor (motor) and a function as a power generator (generator). Output torque from MG 10 is transmitted to drive wheels 30 with motive power transmission gear 20 including a reduction gear and a differential being interposed.

During braking of electrically powered vehicle 1, MG 10 is driven by drive wheels 30 to operate as a power generator. MG 10 thus also functions as a braking apparatus that carries out regenerative braking to convert kinetic energy of electrically powered vehicle 1 into electric power. Regenerated electric power resulting from regenerative braking force in MG 10 is stored in battery 100.

PCU 40 is a power conversion device that bidirectionally converts electric power between MG 10 and battery 100. PCU 40 includes an inverter (three-phase inverter) that converts direct-current (DC) power in battery 100 into alternating-current (AC) power to drive MG 10. The inverter converts AC power (regenerative power) generated by MG 10 into DC power and supplies DC power to battery 100. PCU 40 may include a DC/DC converter that up-converts and down-converts DC power.

SMR 50 is electrically connected to a power line that connects battery 100 and PCU 40 to each other. When SMR 50 is closed (turned on) (that is, in a conducting state) in response to a control signal from ECU 300, electric power is supplied and received between battery 100 and PCU 40. When SMR 50 is opened (turned off) in response to a control signal from ECU 300 (that is, in a disconnected state), on the other hand, electrical connection between battery 100 and PCU 40 is cut off.

Electric power for drive of MG 10 is stored in battery 100. Battery 100 is a rechargeable DC power supply (secondary cell), and composed of a plurality of stacked cells, for example, electrically connected in series. A cell in battery 100 in the present embodiment is implemented by a lithium ion battery. Electrically powered vehicle 1 includes a charging inlet, a charging circuit, and the like that are not shown, and battery 100 is charged by an external power supply.

Monitoring unit 200 includes a voltage sensor 210, a current sensor 220, and a temperature sensor 230. Voltage sensor 210 detects a voltage VB of battery 100 (cell). Current sensor 220 detects a current IB inputted to and outputted from battery 100. Temperature sensor 230 detects a temperature TB of battery 100. Each sensor outputs a result of detection thereby to a battery ECU (BT-ECU) 400.

ECU 300 includes a central processing unit (CPU) 301 and a memory (including, for example, a read only memory (ROM) and a random access memory (RAM)) 302. ECU 300 controls devices such that electrically powered vehicle 1 is in a desired state based on a state of battery 100 transmitted from BT-ECU 400 and signals (for example, an accelerator position signal, a vehicle speed signal, and the like) from not-shown various sensors as well as information such as a map and a program stored in memory 302.

BT-ECU 400 includes a CPU and a memory which are not shown, and calculates a state of charge (SOC) representing an amount of stored power in battery 100 based on current IB and/or voltage VB outputted from monitoring unit 200. The SOC is expressed in a percentage as a ratio of a current amount of stored power to a full charge capacity of battery 100. BT-ECU 400 then outputs the calculated SOC to ECU 300.

An MG-ECU 500 includes a CPU, a memory, a drive circuit that drives PCU 40, and the like (which are not shown), and controls, for example, drive of a switching element of the inverter based on a drive command transmitted from ECU 300.

An HMI-ECU 600 includes a CPU and a memory (not shown) and controls a human machine interface (HMI) device 700. HMI device 700 may be, for example, a multi information display provided in a dashboard of electrically powered vehicle 1. In the present embodiment, HMI device 700 is provided with a PCU failure representation unit (PCU failure indicator) 701 and a battery replacement representation unit (battery replacement indicator) 702.

MG 10 includes a winding (coil). On the occurrence of an abnormal condition and a resultant failure of PCU 40 or a peripheral device thereof such as occurrence of an abnormal condition of a switching element of the inverter, occurrence of an abnormal condition of a current sensor of each phase of MG 10, or occurrence of an abnormal condition of a circuit (for example, an ECU) of MG-ECU 500, simultaneously with the occurrence of the abnormal condition or the failure, the counter electromotive force may be generated by an inductive voltage produced by the coil and applied to battery 100. When this counter electromotive force is generated, a high current is instantaneously generated. Therefore, the high current may be applied to battery 100 before a protective function such as cut-off of SMR 50 is activated.

When a high current is applied to battery 100, battery 100 is greatly damaged and may abruptly deteriorate (rapid deterioration). Rapid deterioration of battery 100 may cause significant lowering in capacity or great heat generation during charging and discharging. Therefore, in some embodiments, the battery 100 is replaced.

In the present embodiment, when a high current caused by the counter electromotive force is applied to battery 100, whether or not battery 100 has rapidly deteriorated is determined. When battery 100 has rapidly deteriorated, notification about requirement for replacement of battery 100 is given so that determination as to requirement for replacement of battery 100 can suitably be made at the time of application of the counter electromotive force to battery 100.

Figure 2:
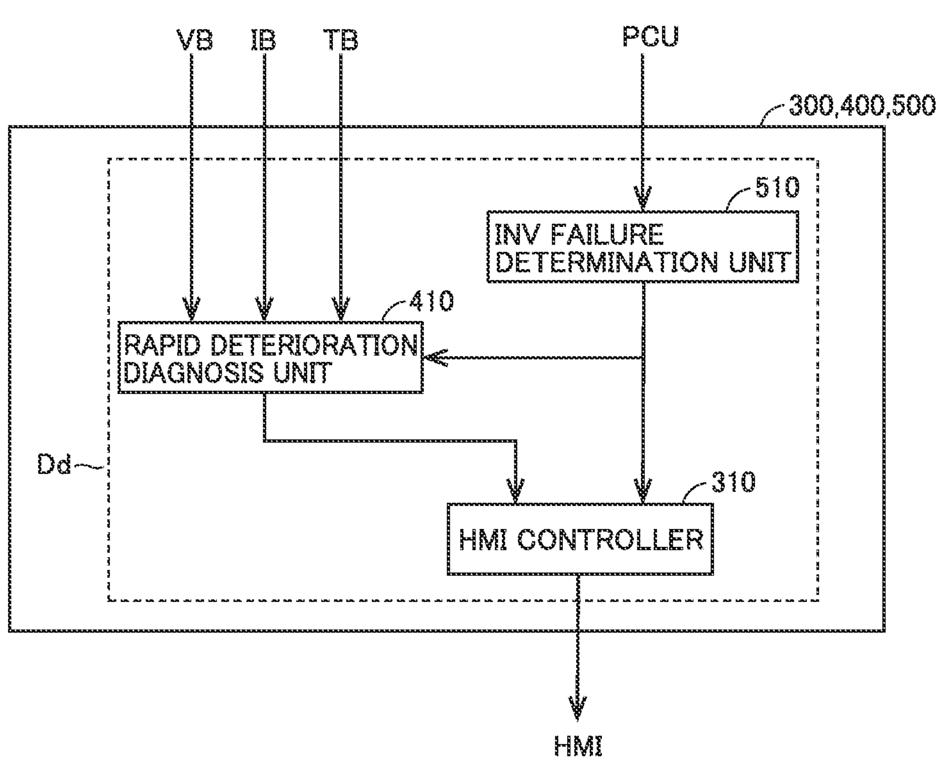
FIG. 2 is a diagram showing an exemplary diagnosis device in the present embodiment.

FIG. 2 is a diagram showing an exemplary diagnosis device Dd in the present embodiment. In the present embodiment, diagnosis device Dd is a functional block configured in ECU 300, BT-ECU 400, and MG-ECU 500. An INV failure determination unit 510 is a functional block configured in MG-ECU 500 and determines whether or not PCU 40 has failed. INV failure determination unit 510 determines that PCU 40 has failed when an abnormal condition occurs in the inverter of PCU 40. NV failure determination unit 510 may determine that PCU 40 has failed not only when an abnormal condition occurs in the inverter but also when PCU 40 is unable to normally control MG 10 as in a case where a current sensor of each phase of MG 10 is in the abnormal condition or a case where the CPU of MG-ECU 500 is in the abnormal condition. When INV failure determination unit 510 determines that PCU 40 has failed, it outputs a failure signal to an HMI controller 310 and a rapid deterioration diagnosis unit 410. Thus, in the present embodiment, when such an event that PCU 40 is unable to normally control MG 10 occurs, it is estimated that a high current may be applied to battery 100, battery 100 may greatly be damaged, and battery 100 may abruptly deteriorate (rapid deterioration).

HMI controller 310 is a functional block configured in ECU 300 and outputs a notification command to HMI-ECU 600. When HMI controller 310 receives a failure signal from INV failure determination unit 510, it outputs a notification command to HMI-ECU 600 to issue a failure notification. When HMI-ECU 600 receives the notification command for the failure notification, it has PCU failure representation unit 701 provide failure representation (turn on a PCU failure indicator).

Rapid deterioration diagnosis unit 410 is a functional block configured in BT-ECU 400. When rapid deterioration diagnosis unit 410 receives the failure signal from INV failure determination unit 510, it determines whether or not battery 100 has rapidly deteriorated. In the present embodiment, though rapid deterioration diagnosis unit 410 receives the failure signal with ECU 300 being interposed, it may directly receive the failure signal from MG-ECU 500 without ECU 300 being interposed.

When rapid deterioration diagnosis unit 410 receives the failure signal from INV failure determination unit 510, it determines whether or not battery 100 has rapidly deteriorated based on current IB and temperature TB. FIG. 3 is a diagram showing an exemplary first map for determination as to rapid deterioration of battery 100. In FIG. 3, the abscissa represents current IB and the ordinate represents temperature TB. When the counter electromotive force is applied to battery 100, current IB is inputted to battery 100. In FIG. 3, a value of the current in a direction of input to battery 100 is defined as being positive. In the first map shown in FIG. 3, a "circle" indicates a region where rapid deterioration of battery 100 has not occurred and a "cross mark" indicates a region where rapid deterioration of battery 100 has occurred. The region where rapid deterioration occurs in battery 100 is different depending on specifications (characteristics) or a type of battery 100, and the first map is set in advance in experiments or the like. In the present embodiment, the first map is set such that the region where rapid deterioration of battery 100 occurs is a region where temperature TB is low and current IB is high as shown in FIG. 3. This is because lithium is more likely to precipitate as temperature TB is lower or current IB (input current) is higher.

When rapid deterioration diagnosis unit 410 receives the failure signal from INV failure determination unit 510, it monitors current IB and temperature TB for several seconds after reception of the failure signal. When current IB and temperature TB enter the region shown with the "cross mark" in the first map, rapid deterioration diagnosis unit 410 determines that rapid deterioration has occurred in battery 100.

Alternatively, when rapid deterioration diagnosis unit 410 receives the failure signal from INV failure determination unit 510, it determines whether or not battery 100 has rapidly deteriorated based on a rate of change ΔVB in voltage VB and temperature TB. FIG. 4 is a diagram showing an exemplary second map for determination as to rapid deterioration of battery 100. In FIG. 4, the abscissa represents rate of change ΔVB in voltage VB and the ordinate represents temperature TB. Rate of change ΔVB in voltage VB is a derivative of voltage VB with respect to time (V/sec.), and represents an amount of change in voltage VB per unit time. In order to find rate of change ΔVB, for example, BT-ECU 400 calculates rate of change ΔVB in voltage VB by dividing a value (voltage VB) detected by voltage sensor 210 by a calculation cycle every prescribed calculation cycle (for example, every several milliseconds to several ten milliseconds). BT-ECU 400 then finds a simple moving average of rates of change ΔVB calculated every calculation cycle as rate of change ΔVB. For example, an average value of latest ten rates of change ΔVB may be found as rate of change ΔVB.

In the second map shown in FIG. 4, a "circle" indicates a region where rapid deterioration of battery 100 has not occurred and a "cross mark" indicates a region where rapid deterioration of battery 100 has occurred. The region where rapid deterioration occurs in battery 100 is different depending on specifications (characteristics) or a type of battery 100, and the second map is set in advance in experiments or the like. In the present embodiment, the second map is set such that the region where rapid deterioration of battery 100 occurs is a region where temperature TB is high and rate of change ΔVB is high as shown in FIG. 4, in order to address increase in overvoltage involved with increase in internal resistance due to deterioration of battery 100.

When rapid deterioration diagnosis unit 410 receives the failure signal from INV failure determination unit 510, it monitors temperature TB and rate of change ΔVB in voltage VB for several seconds after reception of the failure signal. When temperature TB and rate of change ΔVB enter the region indicated with the "cross mark" in the second map, rapid deterioration diagnosis unit 410 determines that rapid deterioration has occurred in battery 100. In the present embodiment, voltage VB is a voltage (cell voltage) of a cell of battery 100, and monitoring unit 200 detects a cell voltage of each cell. When rate of change ΔVB in cell voltage of at least one cell enters the region indicated with the "cross mark" in the second map, rapid deterioration diagnosis unit 410 determines that rapid deterioration has occurred in battery 100.

When rapid deterioration diagnosis unit 410 determines that rapid deterioration has occurred in battery 100, it outputs a deterioration signal to HMI controller 310. When HMI controller 310 receives the deterioration signal from rapid deterioration diagnosis unit 410, it outputs a notification command to HMI-ECU 600 to issue a notification about replacement of battery 100. When HMI-ECU 600 receives the notification command for the notification about replacement, it has battery replacement representation unit 702 provide representation (turn on a battery replacement indicator).

Figure 5:
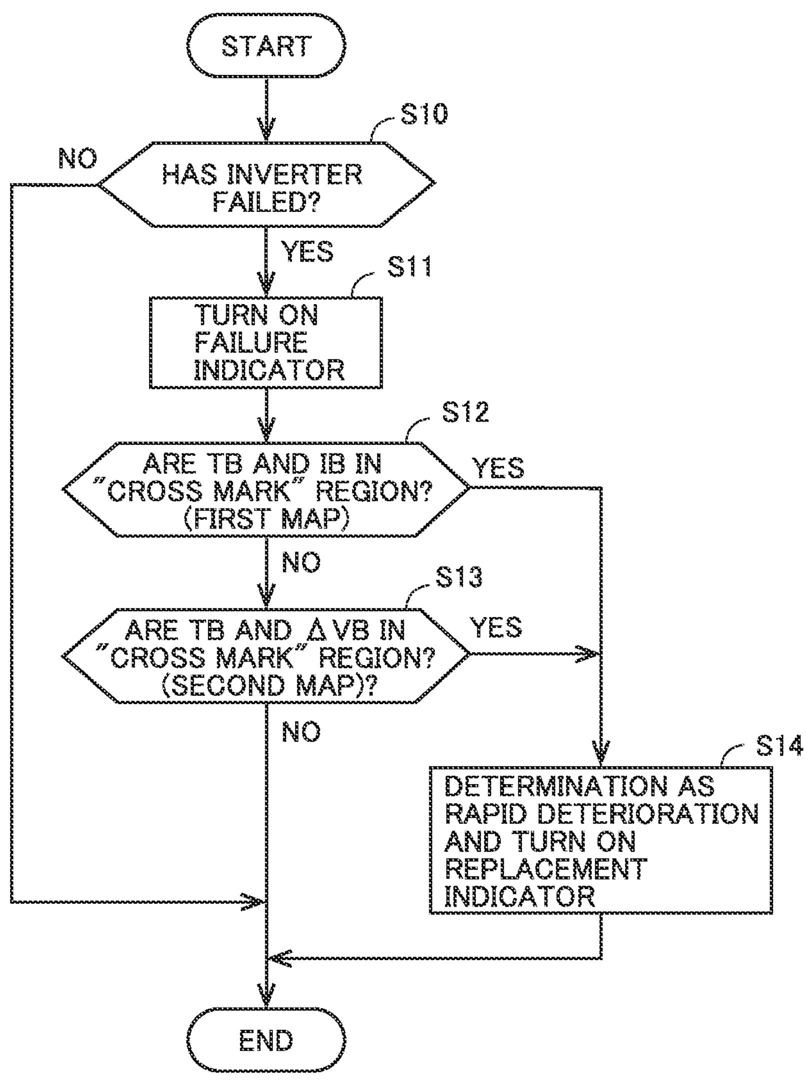
FIG. 5 is a flowchart showing exemplary rapid deterioration diagnosis processing performed in the diagnosis device.

FIG. 5 is a flowchart showing exemplary rapid deterioration diagnosis processing performed in diagnosis device Dd. This flowchart is executed every prescribed period. In a step (the step being abbreviated as "S" below) 10, whether or not an abnormal condition has occurred in the inverter and the inverter has failed is determined. When it is determined that the inverter has failed, determination as YES is made and the process proceeds to S11. When the inverter has not failed, determination as NO is made and the present routine ends. In the present embodiment, when such an event that PCU 40 is unable to normally control MG 10 occurs, it is estimated that a high current may be applied to battery 100, battery 100 may greatly be damaged, and battery 100 may abruptly deteriorate (rapid deterioration). Therefore, in S10, as described above, it may be determined that the inverter has failed not only when the inverter is in the abnormal condition but also when PCU 40 is unable to normally control MG 10.

When the PCU failure indicator is turned on (representation as failure is provided on PCU failure representation unit 701) in S11, the process proceeds to S12. In S12, current IB and temperature TB are monitored for several seconds after determination as YES was made in S10, and whether or not current IB and temperature TB have entered the region indicated with the "cross mark" in the first map is determined. When current IB and temperature TB have entered the region indicated with the "cross mark" in the first map and determination as YES is made, the process proceeds to S14. When current IB and temperature TB do not enter the region indicated with the "cross mark" in the first map, determination as NO is made and the process proceeds to S13.

In S13, current IB and rate of change ΔVB in voltage VB are monitored for several seconds after determination as YES was made in S10, and whether or not temperature TB and rate of change ΔVB have entered the region indicated with the "cross mark" in the second map is determined. When temperature TB and rate of change ΔVB have entered the region indicated with the "cross mark" in the second map and determination as YES is made, the process proceeds to S14. When temperature TB and rate of change ΔVB do not enter the region indicated with the "cross mark" in the second map, determination as NO is made and the present routine ends.

In S14, it is determined that rapid deterioration has occurred in battery 100. In S14, the battery replacement indicator is turned on (representation on battery replacement representation unit 702 is provided) and thereafter the present routine ends.

According to the present embodiment, when PCU 40 fails and the counter electromotive force is applied to battery 100, diagnosis device Dd determines whether or not rapid deterioration has occurred in battery 100 based on temperature TB of battery 100 and current IB inputted to the battery or based on temperature TB and rate of change ΔVB in voltage VB of battery 100. When diagnosis device Dd determines that rapid deterioration has occurred in battery 100, it has battery replacement representation unit 702 provide representation (turn on the battery replacement indicator) and notifies that replacement of battery 10 is required. Thus, when a high current caused by the counter electromotive force is applied to battery 100, whether or not battery 100 has rapidly deteriorated can be diagnosed and determination as to whether or not replacement of battery 10 is required can suitably be made.

In the embodiment, diagnosis device Dd is described as the functional block configured in ECU 300, BT-ECU 400, and MG-ECU 500. Each functional block of diagnosis device Dd, however, may be configured in any ECU. For example, diagnosis device Dd may be configured as the functional block in ECU 300 or as the functional block in BT-ECU 400.

In the embodiment, determination as to rapid deterioration of battery 100 is made with the use of the first map and the second map. Determination as to rapid deterioration of battery 100, however, may be made with the use only of any one map. For example, S12 or S13 does not have to be performed in the flowchart in FIG. 5.

(Modification)

Figure 6:
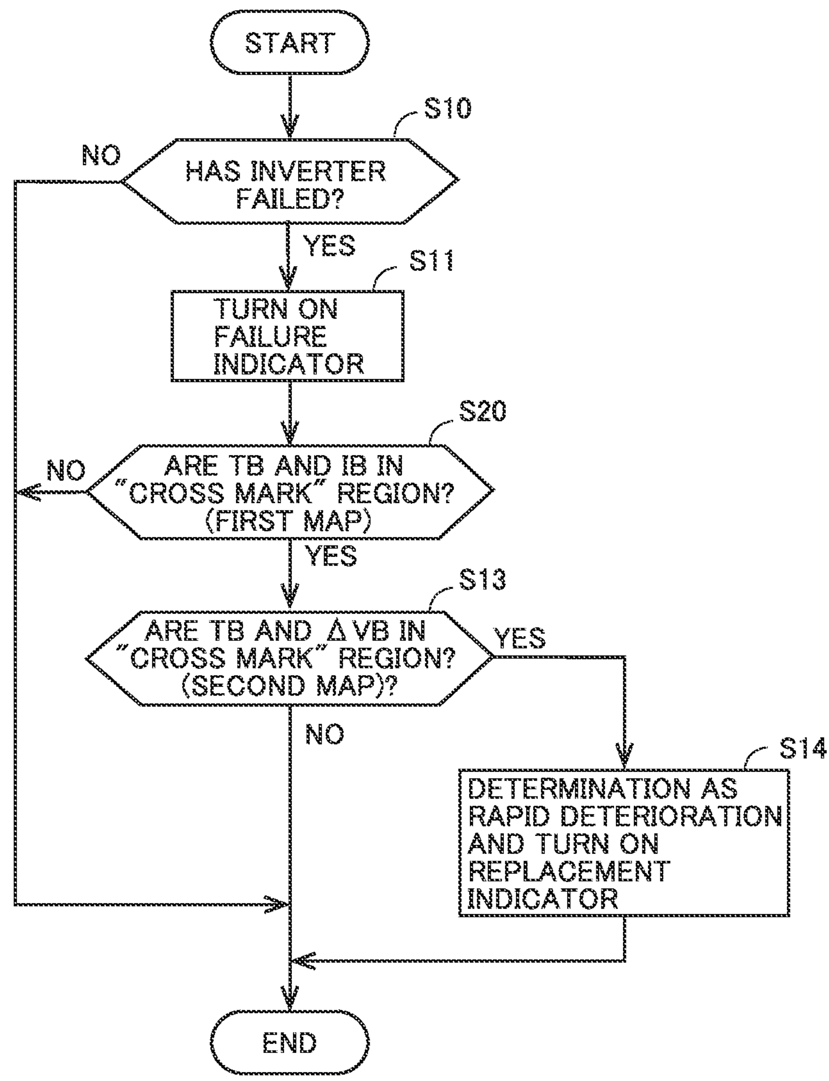
FIG. 6 is a flowchart showing exemplary rapid deterioration diagnosis processing performed in the diagnosis device in a modification.

FIG. 6 is a flowchart showing exemplary rapid deterioration diagnosis processing performed in diagnosis device Dd in a modification. The flowchart in this modification results from replacement of S12 in the flowchart in FIG. 5 with S20. In S20 in the modification, current IB and temperature TB are monitored for several seconds after determination as YES was made in S10, and whether or not current IB and temperature TB have entered the region indicated with the "cross mark" in the first map is determined. When current IB and temperature TB have entered the region indicated with the "cross mark" in the first map and determination as YES is made, the process proceeds to S13. When current IB and temperature TB do not enter the region indicated with the "cross mark" in the first map, determination as NO is made and the present routine ends.

According to this modification, when it is determined that rapid deterioration has occurred in battery 100 based on temperature TB of battery 100 and current IB inputted to the battery (determination as YES in S20) and when it is determined that rapid deterioration has occurred in battery 100 based on temperature TB and rate of change ΔVB in voltage VB of battery 100 (determination as YES in S13), diagnosis (determination) that rapid deterioration has occurred in battery 100 is made and representation on battery replacement representation unit 702 is provided (the battery replacement indicator is turned on) to notify that replacement of battery 100 is required (S14). Therefore, when it is determined that rapid deterioration has occurred with the use of the first map and the second map, battery 100 is diagnosed as having rapidly deteriorated and notification about requirement for replacement of battery 100 is given. Therefore, determination as to whether or not replacement of battery 100 is required can more strictly be determined.

Though a BEV is adopted as electrically powered vehicle 1 shown in FIG. 1, a PHEV or an HEV may be applicable. Alternatively, an industrial vehicle such as a forklift may be applicable.

Though an embodiment of the present disclosure has been described, it should be understood that the embodiment disclosed herein is illustrative and non-restrictive in every respect. The scope of the present disclosure is defined by the terms of the claims and is intended to include any modifications within the scope and meaning equivalent to the terms of the claims.

What is claimed is:

1. An electrically powered vehicle comprising:

a battery;

a motor generator driven with electric power stored in the battery; and a diagnosis device that diagnoses deterioration of the battery, wherein when a counter electromotive force is applied to the battery, the diagnosis device determines whether deterioration has occurred in the battery based on a temperature of the battery and a value of a current inputted to the battery or based on the temperature of the battery and a rate of change in voltage of the battery, wherein the diagnosis device includes:

a first map where the temperature of the battery and the value of the current inputted to the battery are defined as parameters, and a second map where the temperature of the battery and the rate of change in voltage of the battery are defined as parameters, wherein the diagnosis device uses the first map or the second map to determine whether the deterioration of the battery has occurred, wherein the first map is set such that it is determined that the deterioration of the battery has occurred in a region where the temperature of the battery is a first value smaller than a first predetermined threshold value and the value of the current inputted to the battery is a second value greater than a second predetermined threshold value, wherein it is determined whether or not the current and the temperature have entered a first region with a first mark in the first map, and wherein the second map is set such that it is determined that the deterioration of the battery has occurred in a region where the temperature of the battery is a third value greater than a third predetermined threshold value and the rate of change in voltage of the battery is a fourth value greater than a fourth predetermined threshold value, wherein it is determined whether or not the temperature and the rate of change in voltage have entered a second region with a second mark in the second map.

2. The electrically powered vehicle according to claim 1, further comprising a power control unit that supplies electric power stored in the battery to the motor generator and controls the motor generator, wherein when the power control unit fails, the diagnosis device determines that the counter electromotive force has been applied to the battery.

3. The electrically powered vehicle according to claim 1, wherein the diagnosis device makes a diagnosis that replacement of the battery is required when the diagnosis device determines that the deterioration has occurred in the battery based on the temperature of the battery and the value of the current inputted to the battery or when the diagnosis device determines that the deterioration has occurred in the battery based on the temperature of the battery and the rate of change in voltage of the battery.

4. The electrically powered vehicle according to claim 1, wherein the diagnosis device makes a diagnosis that replacement of the battery is required when the diagnosis device determines that the deterioration has occurred in the battery based on the temperature of the battery and the value of the current inputted to the battery and when the diagnosis device determines that the deterioration has occurred in the battery based on the temperature of the battery and the rate of change in voltage of the battery.

5. A method of diagnosing deterioration of a vehicle battery mounted as a motive power source on an electrically powered vehicle, the method comprising:

determining whether a counter electromotive force has been applied to the vehicle battery;

determining whether deterioration has occurred in the vehicle battery based on a temperature of the vehicle battery and a value of a current inputted to the vehicle battery when the counter electromotive force is applied to the vehicle battery;

defining, as parameters, a first map including the temperature of the battery and the value of the current inputted to the battery;

defining, as parameters, a second map including the temperature of the battery and the rate of change in voltage of the battery;

using the first map or the second map to determine whether the deterioration of the battery has occurred;

setting the first map such that it is determined that the deterioration of the battery has occurred in a region where the temperature of the battery is a first value smaller than a first predetermined threshold value and the value of the current inputted to the battery is a second value greater than a second predetermined threshold value, wherein it is determined whether or not the current and the temperature have entered a first region with a first mark in the first map; and setting the second map such that it is determined that the deterioration of the battery has occurred in a region where the temperature of the battery is a third value greater than a third predetermined threshold value and the rate of change in voltage of the battery is a fourth value greater than a fourth predetermined threshold value, wherein it is determined whether or not the temperature and the rate of change in voltage have entered a second region with a second mark in the second map.

6. The method of diagnosing deterioration of a vehicle battery according to claim 5, further comprising determining whether the deterioration has occurred in the vehicle battery based on the temperature of the vehicle battery and a rate of change in voltage of the vehicle battery when the counter electromotive force is applied to the vehicle battery.

7. The method according to claim 5, further comprising monitoring the current the temperature for a predetermined amount of time in response to activation of a failure indicator of the electrically powered vehicle being turned on.

* * * * *